United States Patent
Saneyoshi et al.

(10) Patent No.: US 8,674,774 B2
(45) Date of Patent: Mar. 18, 2014

(54) AGING DIAGNOSTIC DEVICE, AGING DIAGNOSTIC METHOD

(75) Inventors: Eisuke Saneyoshi, Tokyo (JP); Koichi Nose, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 67 days.

(21) Appl. No.: 13/394,542

(22) PCT Filed: Sep. 1, 2010

(86) PCT No.: PCT/JP2010/005387
§ 371 (c)(1),
(2), (4) Date: Mar. 6, 2012

(87) PCT Pub. No.: WO2011/027553
PCT Pub. Date: Mar. 10, 2011

(65) Prior Publication Data
US 2012/0161885 A1 Jun. 28, 2012

(30) Foreign Application Priority Data
Sep. 7, 2009 (JP) ................................ 2009-205774

(51) Int. Cl.
*H03L 7/24* (2006.01)
*G01R 31/28* (2006.01)
(52) U.S. Cl.
USPC .............................................. 331/55; 331/57
(58) Field of Classification Search
USPC ....................................................... 331/55, 57
See application file for complete search history.

(56) References Cited

U.S. PATENT DOCUMENTS

| | | | |
|---|---|---|---|
| 7,332,937 B2 * | 2/2008 | Hsu et al. | 326/95 |
| 7,795,939 B2 * | 9/2010 | Chen et al. | 327/199 |
| 2008/0084228 A1 * | 4/2008 | Liu et al. | 324/763 |

FOREIGN PATENT DOCUMENTS

| | | |
|---|---|---|
| JP | 05-019027 A | 1/1993 |
| JP | 08-139279 A | 5/1996 |
| JP | 09-127186 A | 5/1997 |

OTHER PUBLICATIONS

International Search Report in PCT/JP2010/005387 dated Oct. 19, 2010 (English Translation Thereof).
Tae-Hyoung Kim, Randy Persaud, and Chris H. Kim, "Silicon Odometer: An On-Chip Relibaility for Measuring Frequency Degradation Degradation of Digital Circuits", IEEE Journal of Solid-State Circuits, vol. 43, No. 4, pp. 874-880, Apr. 2008.

* cited by examiner

*Primary Examiner* — Joseph Chang
(74) *Attorney, Agent, or Firm* — McGinn IP Law Group, PLLC (57) ABSTRACT

There is provided an aging diagnostic device including: a reference ring oscillator (101) that constitutes a ring oscillator using an odd-numbered plurality of logic gates constituted using a CMOS circuit; a test ring oscillator (102) that constitutes a ring oscillator using an odd-numbered plurality of logic gates having the same configuration as that of the logic gate; a load unit (104) that inputs a load signal to the test ring oscillator (102); a control unit (105) that simultaneously inputs a control signal instructing a start of oscillation of the reference ring oscillator (101) and the test ring oscillator (102) to the reference ring oscillator (101) and the test ring oscillator (102); and a comparison unit (103) that compares differences in the amount of movement of pulses within the reference ring oscillator (101) and the test ring oscillator (102), respectively, in the same time.

7 Claims, 7 Drawing Sheets

AGING DIAGNOSTIC DEVICE, AGING DIAGNOSTIC METHOD

TECHNICAL FIELD

The present invention relates to an aging diagnostic device of a semiconductor integrated circuit and an aging diagnostic method thereof. Particularly, the present invention relates to an aging diagnostic device of a semiconductor integrated circuit which has small dimensions, is highly resistant to environmental influence and is easily used and introduced into a semiconductor circuit, and an aging diagnostic method thereof.

BACKGROUND ART

Semiconductor chips become defective goods when performance degradation thereof above a certain level progresses due to use after shipment. It is considered that performance degradation due to use is caused by the lifetime (performance degradation appropriate to aging), or caused by incidental failure, and the like. However, when a semiconductor chip is determined as defective goods during maintenance and the like, it may be difficult to assess whether the defect thereof is caused by the lifetime (performance degradation appropriate to aging), or caused by incidental failure and the like.

On the other hand, the assessment of whether the cause of the performance degradation is caused by the lifetime or caused by incidental failure and the like is important from the viewpoint of feedback to the design. When the degree of progression of the performance degradation due to the lifetime of a semiconductor integrated circuit after shipment is understood in advance, this assessment can be realized with relative ease. In addition, when log information of the degree of progression of the performance degradation due to the lifetime is acquired, it is possible to anticipate the proper time for replacement of the semiconductor integrated circuit, and to make use of setting optimal maintenance time.

Here, as a method generally used in order to understand the degree of progression of the performance degradation due to the lifetime of the semiconductor integrated circuit, as disclosed in Non-Patent Document 1, there is a method of calculating the degree of degradation by constituting a ring oscillator using a CMOS circuit and detecting a change in the oscillation frequency thereof. The oscillation frequency can be digitally coded by using a counter, and a diagnosis of the degree of degradation can be performed with a simple configuration without using an external measuring instrument. In addition, in a technique disclosed in Non-Patent Document 1, the resolution of the degree of degradation in a utility area is improved by using two test and reference ring oscillators, thereby allowing the measurement time to be shortened.

RELATED DOCUMENT

Nonpatent Document

[Non-Patent Document 1] Tae-Hyoung Kim, Randy Persaud, and Chris H. Kim, "Silicon Odometer: An On-Chip Reliability Monitor for Measuring Frequency Degradation of Digital Circuits", IEEE JOURNAL OF SOLID-STATE CIRCUITS, VOL. 43, NO. 4, pp. 874-880, April, 2008

However, in the method of determining the degree of degradation by detecting a change in the oscillation frequency of the ring oscillator, there is a problem that the oscillation frequency to be measured is influenced by the environment (for example, variation in the chip temperature or the power-supply voltage) and thus is highly varied. This problem is solved to some extent by measuring the ratio of the oscillation frequencies using two ring oscillators in the technique of Non-Patent Document 1. However, in the case of the method, since signals of the difference frequencies of two ring oscillators are generated, and the degree of degradation is detected by the signals of the difference frequencies and one of the two ring oscillators, concern that the influence of environmental variation is added between the signals of the difference frequencies and one of the two ring oscillators cannot be avoided, and the influence of environmental variation to some extent is undergone as before.

In addition, it is known that the degradation of performance due to NBTI in the aging degradation is recovered when stress is removed. However, the mechanisms of the degradation and the recovery are not elucidated in detail, and the diagnosis of the degree of degradation is preferably performed in a state where the influence of the recovery is removed insofar as possible. For this reason, the sooner the measurement time is, the better.

The invention is to provide an aging diagnostic device of a semiconductor integrated circuit and an aging diagnostic method thereof which are capable of canceling the environmental influence at the time of the measurement of a progression state of performance degradation of a semiconductor integrated circuit, with a simple configuration, and capable of performing the measurement in a short period of time.

DISCLOSURE OF THE INVENTION

According to the invention, there is provided an aging diagnostic device including: a first ring oscillator that constitutes a ring oscillator using an odd-numbered plurality of logic gates constituted using a CMOS circuit; a second ring oscillator that constitutes a ring oscillator using an odd-numbered plurality of logic gates having the same configuration as that of the logic gate; a load unit that inputs a load signal to the first ring oscillator or the second ring oscillator; a control unit that simultaneously inputs a control signal instructing a start of oscillation of the first ring oscillator and the second ring oscillator to the first ring oscillator and the second ring oscillator; and a comparison unit that compares differences in the amount of movement of pulses within the first ring oscillator and the second ring oscillator, respectively, in the same time.

In the aging diagnostic device according to the invention, the second ring oscillator may constitute a ring oscillator using the logic gates having the same number as that of the first ring oscillators.

In the aging diagnostic device according to the invention, when the logic gates of each of the first ring oscillator and the second ring oscillator to which the control signal is directly input from the control unit are set to first logic gates, and logic gates to which each output signal of N-th logic gates is input are set to (N+1)-th logic gates, the comparison unit may include a first counter that counts a pulse number of an output signal of an M-th logic gate of the first ring oscillator, a second counter that counts a pulse number of an output signal of an M-th logic gate of the second ring oscillator; at least two first storage units that store signals output from at least two of the plurality of logic gates constituting the first ring oscillator at that time, respectively, and a second storage unit to which a count value of the first counter is input, and when the second counter counts a predetermined number which is previously set, using the count of the predetermined number as a trigger, the second counter may output a signal for data storage to the first storage unit and the second storage unit.

In the aging diagnostic device according to the invention, the comparison unit may include a plurality of first storage units that store signals output from all the logic gates constituting the first ring oscillator at that time, respectively.

According to the invention, there is provided an aging diagnostic method including: a step of inputting a load signal to a first ring oscillator that constitutes a ring oscillator using an odd-numbered plurality of logic gates constituted using a CMOS circuit or a second ring oscillator that constitutes a ring oscillator using an odd-numbered plurality of logic gates having the same configuration as that of the logic gate; a step of simultaneously inputting a control signal that instructs a start of oscillation of the first ring oscillator and the second ring oscillator to the first ring oscillator and the second ring oscillator; and a step of comparing differences in the amount of movement of pulses within the first ring oscillator and the second ring oscillator, respectively, in the same time.

In the aging diagnostic method according to the invention, the second ring oscillator constitutes a ring oscillator using the logic gates having the same number as that of the first ring oscillators.

In the aging diagnostic method according to the invention, when the logic gates of each of the first ring oscillator and the second ring oscillator to which the control signal is directly input from the control unit are set to first logic gates, and logic gates to which each output signal of an N-th logic gates is input are set to (N+1)-th logic gates, in a case where a count value of a pulse number of an output signal of an M-th logic gate of the first ring oscillator becomes a predetermined number which is previously set, the step of comparing differences in the amount of movement of pulses may include a step of detecting the amount of movement of pulses within the second ring oscillator by detecting a count value of a pulse number of an output signal of an M-th logic gate of the second ring oscillator and a value of an output signal of each of the plurality of logic gates constituting the second ring oscillator, using the count of the predetermined number as a trigger.

The aging diagnostic device and the aging diagnostic method according to the invention perform the diagnosis of the degree of degradation of the test ring oscillator, that is, the degree of degradation of the logic gates constituting the test ring oscillator, by comparing the differences in the number of signal propagation stages of a plurality of logic gates constituting each of the ring oscillators in a certain given period of time, using the test ring oscillator to which the load signal is input in a given period of time and the reference ring oscillator to which the load signal is not input.

According to the invention, since the diagnosis of the degree of degradation of the test ring oscillator, that is, the degree of degradation of the logic gates constituting the test ring oscillator can be performed, for example, by detecting that the signal passes through the logic gates within the test ring oscillator by a certain given number of stages, and detecting the number of signal passage stages of the logic gates within the reference ring oscillator at this timing, the aging diagnostic device according to the invention may be formed with a simple configuration.

According to the invention, it is possible to realize the measurement in a short period of time with a simple configuration, without being nearly influenced by the environment at the time of the measurement of a progression state of performance degradation of a semiconductor integrated circuit.

BRIEF DESCRIPTION OF THE DRAWINGS

The above-mentioned objects, other objects, features and advantages will be made clearer from the preferred embodiments described below, and the following accompanying drawings.

DESCRIPTION OF EMBODIMENTS

Hereinafter, embodiments of the invention will be described with reference to the accompanying drawings. In all the drawings, like elements are referenced by like reference numerals and signs, and descriptions thereof will not be repeated.

Embodiment 1

Figure 1:
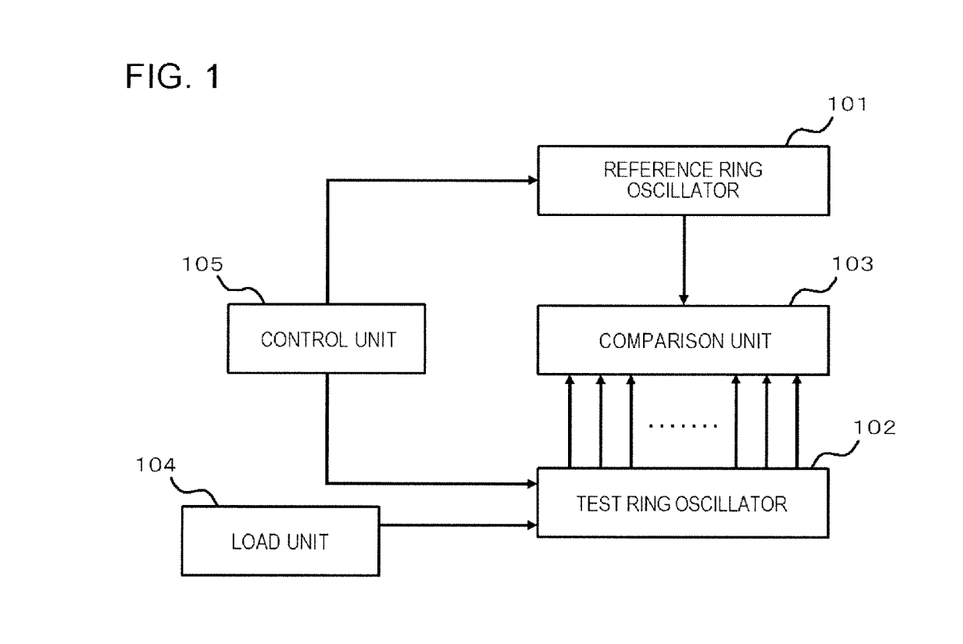
FIG. 1 is a block diagram illustrating a configuration of an aging diagnostic device according an embodiment 1.

FIG. 1 is a block diagram illustrating a configuration of an aging diagnostic device according to an embodiment 1 of the invention. As shown in FIG. 1, the aging diagnostic device according to the embodiment includes a reference ring oscillator 101, a test ring oscillator 102, a comparison unit 103, a load unit 104, and a control unit 105. Meanwhile, the aging diagnostic device according to the embodiment includes the test ring oscillator 102 as a first ring oscillator, and includes the reference ring oscillator 101 as a second ring oscillator.

The aging diagnostic device according to the embodiment can be configured as an aging diagnostic circuit. The premise is similar in all the following embodiments.

The test ring oscillator 102 constitutes a ring oscillator by connecting an odd-numbered plurality (arbitrary design matter) of logic gates constituted using a CMOS circuit to multiple stages. That is, the test ring oscillator is configured such that signals are circulated in the inside thereof by sequentially connecting inputs and outputs of an odd-numbered plurality of logic gates, and the transition of the signals is periodically repeated focused on a certain node. At this time, a plurality of logic gates is preferably of the same type.

The reference ring oscillator 101 constitutes a ring oscillator using an odd-numbered plurality of logic gates having the same configuration as a logic gate constituting the test ring oscillator. The logic gate having the same configuration means a logic gate constituted by a CMOS circuit having the same design. Meanwhile, the number of logic gates used for constituting a ring oscillator is particularly limited, but is preferably set to the same number as that of the test ring oscillators 102. In this way, it is possible to make the configurations of the test ring oscillator 102 and the reference ring oscillator 101 equal insofar as possible, and to improve the accuracy of measurement of the degree of degradation.

The load unit 104 is configured to input a load signal to the test ring oscillator 102. It is possible to cause the degradation of a plurality of logic gates constituting the test ring oscillator 102 to progress, by the input of the load signal. Although the load signal is not particularly limited, it is possible to cause the degradation to progress using an arterial clock signal and the like, for example, in order to simulate degradation progression through an actual operation of a functional circuit within a semiconductor chip to be diagnosed in which a diagnostic circuit is mounted.

In the meantime, while the load unit 104 inputs the load signal to the test ring oscillator 102, the reference ring oscillator 101 is in a state where stress is not applied, for example, in a state where a power-supply terminal is connected to a GND. In this state, the degradation of the logic gate constituting the reference ring oscillator 10 does not nearly progress.

The control unit 105 is configured to simultaneously input a control signal instructing the start of the oscillation of the reference ring oscillator 101 and the test ring oscillator 102 to the reference ring oscillator 101 and the test ring oscillator 102.

The comparison unit 103 is configured to compare differences in the amount of movement of pulses within the reference ring oscillator 101 and the test ring oscillator 102, respectively, in the same time. A unit that compares the differences in the amount of movement of pulses is particularly limited, but may be the following unit.

For example, when the control unit 105 simultaneously inputs the control signal instructing the start of the oscillation to the reference ring oscillator 101 and the test ring oscillator 102, the comparison unit 103 detects that the pulse passes through the logic gates constituting the reference ring oscillator 101 by the specified number of stages (the specified number of logic gates) which is previously set. Using this detection as a trigger, the comparison unit detects a state within the test ring oscillator 102, that is, how many stages the pulse passes through the logic gates within the test ring oscillator 102. The comparison unit 103 compares the differences in the amount of movement of pulses in the reference ring oscillator 101 and the test ring oscillator 102, respectively, in the same time, using the detected result mentioned above (the number of stages by which the pulse passes through the logic gate within the test ring oscillator 102), and the specified number of stages which is previously set as mentioned above (the number of stages by which the pulse passes through the logic gates within the reference ring oscillator 101). Meanwhile, in the above-mentioned unit, even when the reference ring oscillator 101 and the test ring oscillator 102 are switched to each other, that is, even when the comparison unit is configured to detect that the pulse passes through the logic gates constituting the test ring oscillator 102 by the specified number of stages which is previously set (the specified number of logic gate), and to detect a state within the reference ring oscillator 101 using this detection as a trigger, that is, how many stages the pulse passes through the logic gates within the reference ring oscillator 101, similarly, it is possible to compare the differences in the amount of movement of pulses in the reference ring oscillator 101 and the test ring oscillator 102, respectively.

In this manner, when the number of passage stages of the logic gates in the reference ring oscillator 101 and the test ring oscillator 102, respectively, in the same time can be known, the ratio thereof becomes an inverse number of the ratio of the delay time per stage of each of the logic gates. Since the difference in the delay time of the logic gates is generated by the presence or absence of the degradation, the state of aging can be obtained as the ratio of an increase in the delay time.

Meanwhile, the unit that compares the differences in the amount of movement of pulses mentioned above can be realized, for example, by adding the following configuration to the above-mentioned configuration of the aging diagnostic device according to the embodiment.

That is, the above-mentioned unit can be realized by adding a configuration in which when the logic gates of each of the reference ring oscillator 101 and the test ring oscillator 102 to which the control signal is directly input from the control unit 105 are set to first logic gates, and logic gates to which each output signal of an N-th logic gates is input are set to an (N+1)-th logic gates, the comparison unit 103 includes a first counter that counts a pulse number of an output signal of an M-th logic gate of the test ring oscillator 102; a second counter that counts a pulse number of an output signal of an M-th logic gate of the reference ring oscillator 101; at least two first storage units that store signals output from at least two of a plurality of logic gates constituting the test ring oscillator 102 at that time, respectively; a second storage unit to which a count value of the first counter is input, and when a predetermined number which is previously set is counted, the second counter outputs a signal for data storage to the first storage unit and the second storage unit, using the count of the predetermined number as a trigger.

Meanwhile, the comparison unit 103 may be configured to include a plurality of first storage units that stores signals output from all the logic gates constituting the test ring oscillator 102 at that time, respectively, instead of the above-mentioned first storage unit. In such a configuration, when the number of stages of the logic gates constituting the reference ring oscillator 101 and the test ring oscillator 102, respectively, is grasped, the comparison unit 103 can calculate how many stages the pulse passes through the logic gates within each of the ring oscillators.

The aging diagnostic device according to the embodiment does not measure the oscillation frequency of the ring oscillator, but measures how long the pulse moves within the ring oscillator, that is, how many stages the pulse passes through the logic gates constituting the ring oscillator. In such a respect, the aging diagnostic device is different from a device in the related art.

In addition, the aging diagnostic device according to the embodiment compares the differences in the amount of movement of pulses in the state where the timings from the start of the oscillation of two ring oscillators to the end thereof are matched to each other, using the reference ring oscillator 101 and the test ring oscillator 102. Therefore, for example, even when the aging diagnostic device suffers from the environmental change (the power-supply voltage or the temperature), both the reference ring oscillator 101 and the test ring oscillator 102 are influenced similarly. Consequently, the influence of noise is nearly canceled in the step of comparing the differences in the amount of movement of pulses of the reference ring oscillator 101 and the test ring oscillator 102, respectively. As a result, in the diagnosis of the degree of degradation of the logic gates constituting the test ring oscillator 102, the measurement without being nearly influenced by the environmental change can be made. In addition, a special analog circuit and the like are also required, and the realization can be made with a simple configuration.

Figure 2:
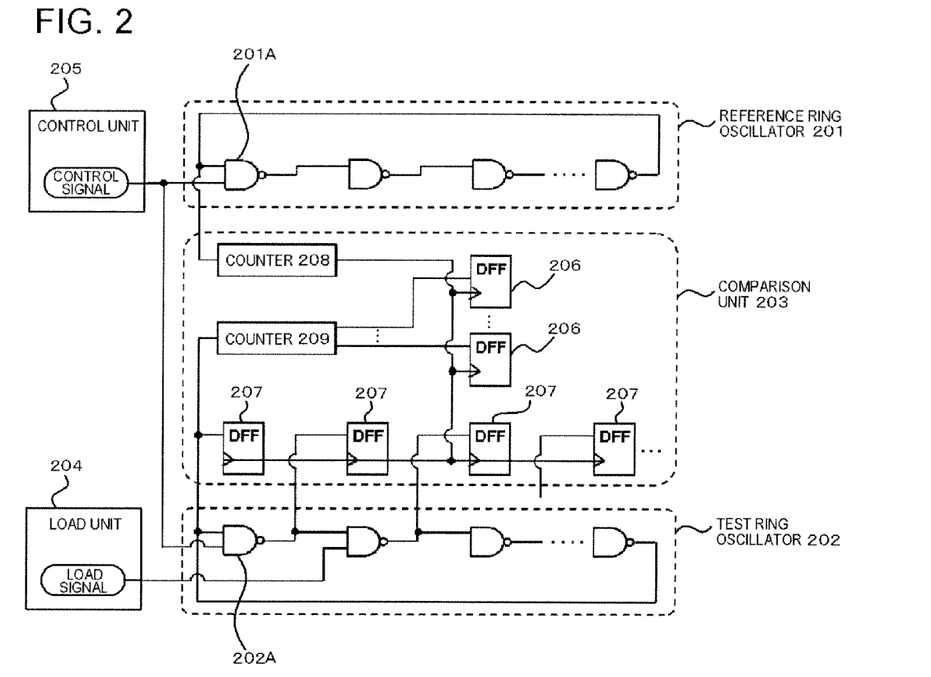
FIG. 2 is a block diagram illustrating a specific example of the configuration of the aging diagnostic device according to the embodiment 1.

Next, a specific example of the aging diagnostic device according to the embodiment will be described with reference to FIG. 2. FIG. 2 illustrates specific configuration examples of the reference ring oscillator 101, the test ring oscillator 102, the comparison unit 103, the load unit 104, and the control unit 105 shown in FIG. 1, and a connection method thereof. Meanwhile, elements unnecessary for description or the description thereof and the like will be not repeated, and it will be obvious that they are not limited as the only configuration capable of achieving an object of the invention. The premise is similar to those of the other embodiments.

As shown in FIG. 2, as the logic gates constituting the reference ring oscillator 201 and the test ring oscillator 202, for example, a NAND gate can be used. The reference ring oscillator 201 and the test ring oscillator 202 are configured to be connected to the same number of stages using an odd-numbered plurality of NAND gates having the same configuration. In addition, the reference ring oscillator 201 and the test ring oscillator 202 are configured such that the oscillation can be controlled by the same control signal from a control unit 205. The start of the oscillation of the reference ring oscillator 201 and the test ring oscillator 202 can be simultaneously performed with such a configuration. The test ring oscillator 202 is configured such that it is further provided with a load signal input from a load unit 204, and can create an arbitrary degradation environment.

A comparison unit 203 can be realized, for example, by a combination of a counter circuit and a flip-flop circuit.

A counter circuit 208 is connected so as to input an output signal of a certain logic gate of a plurality of logic gates constituting the reference ring oscillator 201, and when an arbitrary set value is set to a count, the counter circuit outputs a High or Low signal using the count as a trigger. This output signal is input to flip-flop circuits 206 and 207 described below, and the flip-flop circuits 206 and 207 save data stored at that point in time using the input signal.

Next, when the logic gates of a plurality of logic gates constituting the reference ring oscillator 201 and the test ring oscillator 202, respectively, to which the control signal is directly input from the control unit 205 are set to first logic gates 201A and 202A, and the logic gate to which an output signal of an N-th logic gate is input is set to an (N+1)-th logic gate, the counter circuit 208 is connected so as to input an output signal of an M-th logic gate of the reference ring oscillator 201, and then a counter circuit 209 is connected so as to input an output signal of an M-th logic gate of a plurality of logic gates constituting the test ring oscillator 202. In addition, the counter circuit 209 outputs a count value to a flip-flop circuit 206. Meanwhile, the bit number of the counter circuit 209 is an arbitrary design matter, and the flip-flop circuit 206 is provided with as many as the bit number of the counter circuit 209. The flip-flop circuit 206 saves a value using the output signal from the counter circuit 208.

Flip-flop circuits 207 are connected between all the logic gate stages of the test ring oscillator 202, and a plurality of flip-flop circuits is provided so as to store each of the signals output from all the logic gates at that time. Meanwhile, the flip-flop circuits 207 do not necessarily store the signals output from all the logic gates at that time, and when the flip-flop circuits are provided so as to store the signals output from at least two logic gates at that time, the degree of degradation of the test ring oscillator 202 can be detected. However, in order to measure the progression of aging of the test ring oscillator 202 with a higher degree of accuracy, as shown in FIG. 2, a plurality of flip-flop circuits 207 is preferably provided so as to store each of the signals output from all the logic gates at that time. The flip-flop circuits 207 save values using the output signal from the counter circuit 208. Meanwhile, the flip-flop circuits 207 shown in the drawing are flip-flop circuits of a portion of the configuration example.

Next, a flow of a specific process in the configuration example will be described.

First, the load unit 204 adds a load signal (arterial clock signal and the like) to the test ring oscillator 202 at a predetermined time, and causes the degradation of the logic gates constituting the test ring oscillator 202 to progress. At this time, the reference ring oscillator 201 is, for example, in a state where a power-supply terminal is connected to a GND. In this state, the degradation of the logic gates constituting the reference ring oscillator 201 does not nearly progress.

When the above-mentioned process of adding a load signal to the test ring oscillator 202 at a predetermined time is terminated, the power-supply terminal is connected to a normal power supply in the case of the state where the power-supply terminal of the reference ring oscillator 201 is connected to the GND. Thereafter, the control unit 205 simultaneously inputs a control signal instructing the start of the oscillation to the reference ring oscillator 201 and the test ring oscillator 202.

Then, the counter circuit 208 counts the pulse number of the signal input to the first logic gate 201A of the reference ring oscillator 201. In addition, the counter circuit 209 counts the pulse number of the signal input to the first logic gate 202A of the test ring oscillator 202, and outputs a count value to the flip-flop circuit 206. Each of the flip-flop circuits 206 stores a "High" or "Low" value, and the count value of the counter circuit 209 at that time is specified by the values stored in all the flip-flop circuits 206. In addition, the flip-flop circuits 207 store an output signal (High or Low) of each logic gate of the test ring oscillator 202 at that time.

Thereafter, when the counter circuit 208 counts a predetermined number which is previously set, the counter circuit outputs a signal (High or Low) for data storage to the flip-flop circuits 206 and 207, using the count as a trigger. The flip-flop circuits 206 and 207 save the value (High or Low) stored at that time using this signal.

Thereafter, an operation section (not shown) of the comparison unit 203 collects the values (count numbers) stored in the flip-flop circuits 206, and identifies the count number. In addition, the value (High or Low) stored in each of the flip-flop circuits 207 is collected so as to identify that it is an output signal of the M-th logic gate. The boundary line between "High" and "Low" (for example, between a fifth logic gate and a sixth logic gate) of the value (High or Low) stored in each of a plurality of flip-flop circuits 207 is identified, to thereby calculate the amount of movement of the pulse within the test ring oscillator 202 in a point in time when a signal for data storage is output from the counter circuit 208. Thereafter, the differences in the amount of movement of pulses of the reference ring oscillator 201 and the test ring oscillator 202, respectively, in the same time are compared using the amount of movement calculated and the predetermined number, which is previously set, counted by the counter circuit 208. In this comparison, the count number is converted into the number of stages of the logic gates, and the comparison may be performed using the number of stages of the logic gates in which the pulse passes through the reference ring oscillator 201 and the test ring oscillator 202, respectively.

In such a method, it is possible to control the measurement time and the resolution by controlling the number of stages of the logic gates constituting the reference ring oscillator 201, a predetermined number, which is previously set, counted by the counter circuit 208, and a position for connecting the counter circuit 208.

Here, the reference ring oscillator 201 and the test ring oscillator 202 shown in FIG. 2 are constituted by the X stages of the logic gates. In addition, in the counter circuit 208, the predetermined number, which is previously set, counted using the signal output from the M-th logic gate is set to C, the delay time per stage of the logic gate within the reference ring oscillator 201 is set to Tref, and the delay time per stage of the logic gate within the test ring oscillator 202 is set to Tdeg. Meanwhile, Tref is the delay time per stage of the logic gate in a state where the degradation does not nearly progress, and Tdeg is the delay time per stage of the logic gate in a state where the degradation progresses due to the load signal of the load unit 204.

The pulse number counted by the counter circuit 209 using the signal output from the M-th logic gate of the test ring oscillator 202 in a point in time when the counter circuit 208 counts the predetermined number C is set to C', and the number of gate passage stages (obtained by the flip-flop circuits 207) of the fractional number which is not obtained in the count through the counter circuit 209 is set to N. Meanwhile, when the counter circuits 208 and 209 counts "1" in a point in time when the pulse signal changes from "High" to "Low" and changes to "High" again, the relationship of "N<2X" is established.

At this time, the relationship of the following expression (1) is satisfied.

$$Tref \cdot 2X \cdot C = Tdeg \cdot (2X \cdot C' + N) \quad (1)$$

Therefore, the degree of progression of the degradation is expressed by the following expression (2).

$$Tdeg/Tref - 1 = (2X \cdot C)/(2X \cdot C' + N) - 1 \quad (2)$$

That is, N decreases as the degradation progress. When N becomes 0, C' decreases by 1 and N becomes 2X, and N decreases from the value again.

Meanwhile, in the above-mentioned description, a case in which the reference ring oscillator 201 and the test ring oscillator 202 are constituted by the X stages of the logic gates having the same number is described by way of example. However, even when the number of logic gates constituting the reference ring oscillator 201 and the test ring oscillator 202 is different, it is possible to compare the differences in the amount of movement of pulses, that is, the differences in the number of logic gate passage stages, on the basis of the above-mentioned expression. The premise is similar to all the following embodiments.

Embodiment 2

The aging diagnostic device according to an embodiment 2 is based on the embodiment 1. Hereinafter, the difference from the embodiment 1 will be described. Meanwhile, the description with respect to the common point will not be repeated.

Figure 3:
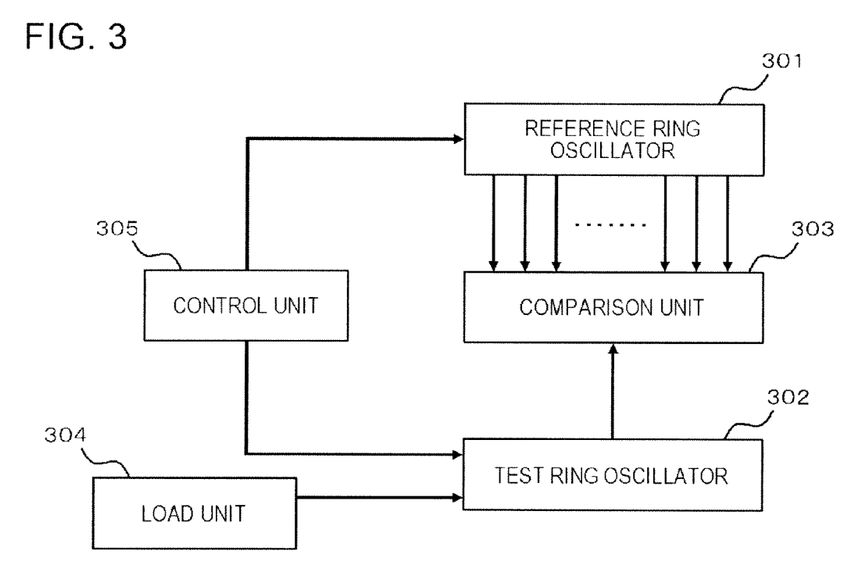
FIG. 3 is a block diagram illustrating a configuration of an aging diagnostic device according to an embodiment 2.

FIG. 3 is a block diagram illustrating a configuration of an aging diagnostic device according to the embodiment 2 of the invention. As shown in FIG. 3, the aging diagnostic device according to the embodiment includes a reference ring oscillator 301, a test ring oscillator 302, a comparison unit 303, a load unit 304, and a control unit 305.

The aging diagnostic device according to the embodiment is different from the embodiment 1 in that the aging diagnostic device includes the reference ring oscillator 301 as a first ring oscillator, and includes the test ring oscillator 302 as a second ring oscillator. That is, the aging diagnostic device according to the embodiment detects the amounts of movement of pulses moving within the reference ring oscillator 301 in a point in time when the pulses move within the test ring oscillator 302 by a predetermined amount (for example, in a point in time when a counter connected to the test ring oscillator 302 counts a predetermined number which is previously set), and compares the amounts of movement. Meanwhile, the other configurations are similar to those of the embodiment 1, and the above-mentioned process can be realized according to the embodiment 1. Therefore, the detailed description herein will not be repeated.

According to the aging diagnostic device and the aging diagnostic method of the embodiment, the measurement time and the resolution are specified by the node selection of the test ring oscillator 302, and thus an effect that the measurement resolution becomes linear is obtained with respect to the embodiment 1.

Next, a specific example of the aging diagnostic device according to the embodiment will be described. The configuration example can be realized by reversing the relationship of the connection between the comparison unit 203 and the reference ring oscillator 201 and the relationship of the connection between the comparison unit 203 and the test ring oscillator 202, in the configuration example of FIG. 2 showing the specific example of the embodiment 1.

Here, when the degree of progression of the degradation is evaluated using the signs similar to the embodiment 1, first, the following expression (3) is satisfied from the measurement result.

$$Tref \cdot (2X \cdot C' + N) = Tdeg \cdot 2X \cdot C \quad (3)$$

Therefore, the degree of progression of the degradation is expressed by the following expression (4).

$$Tdeg/Tref - 1 = (2X \cdot C' + N)/(2X \cdot C) - 1 \quad (4)$$

That is, N increases as the degradation progresses. When N becomes 2X, C' increases by 1 and N becomes 0, and N increases from the value again.

Embodiment 3

An aging diagnostic device according to an embodiment 3 is based on the embodiment 1. Hereinafter, the difference from the embodiment 1 will be described. Meanwhile, the description with respect to the common point will not be repeated.

Figure 4:
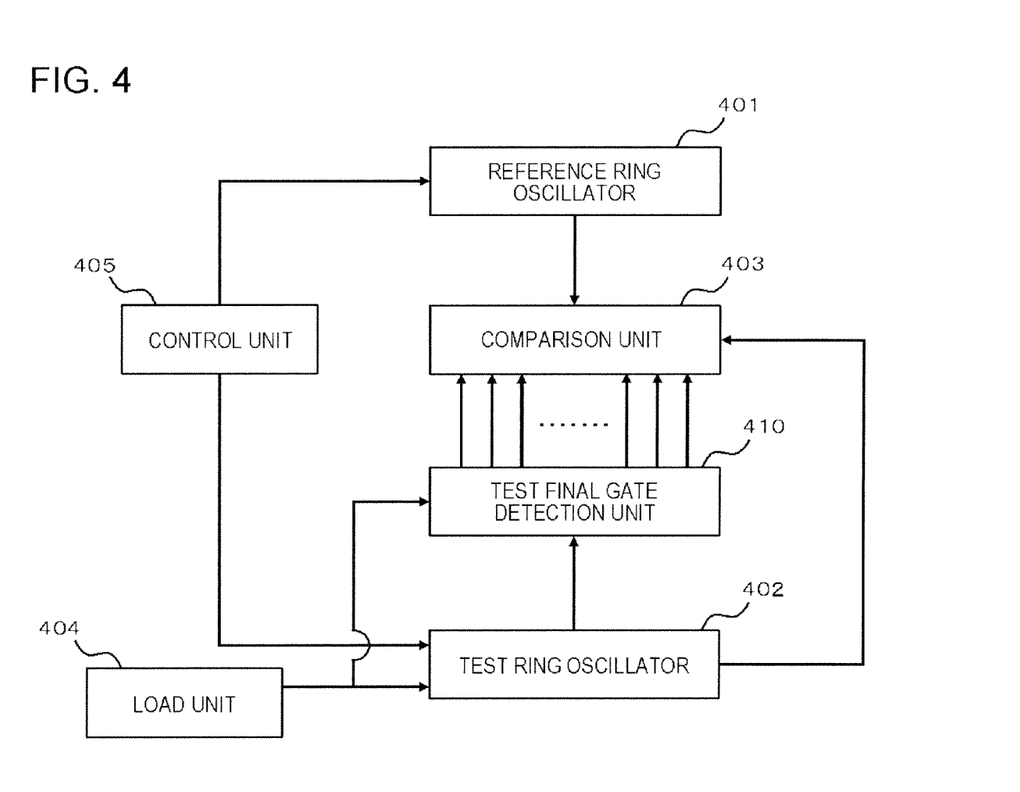
FIG. 4 is a block diagram illustrating a configuration of an aging diagnostic device according to an embodiment 3.

FIG. 4 is a block diagram illustrating a configuration of an aging diagnostic device according to the embodiment 3 of the invention. As shown in FIG. 4, the aging diagnostic device according to the embodiment includes a reference ring oscillator 401, a test ring oscillator 402, a comparison unit 403, a load unit 404, a control unit 405, and a test final gate detection unit 410. Meanwhile, the aging diagnostic device according to the embodiment includes the test ring oscillator 402 as a first ring oscillator, and includes the reference ring oscillator 401 as a second ring oscillator.

The test final gate detection unit 410 is configured to serially connect logic gates having the same configuration as logic gates constituting the reference ring oscillator 401 and the test ring oscillator 402, using the same number or more of the reference ring oscillator 401 and the test ring oscillator 402.

A load signal is input to the test final gate detection unit 410 from the load unit 404 in the same conditions (the same load signal and the same time) as those of the test ring oscillator 402.

In addition, whenever the pulse number of an output signal of, for example, an M-th logic gate of the test ring oscillator 402 is counted, a signal (High or Low) is input to an initial logic gate of the test final gate detection unit 410 in which a plurality of logic gates is connected in series. This signal is propagated through a plurality of logic gates connected in series. In the embodiment, the number of stages in which the control signal passes through the logic gates to which the load signal is added is detected using the amount of movement of the signal propagated through the test final gate detection unit 410.

With the configuration, there is obtained an effect that the drive loads of the reference ring oscillator 401 and the test ring oscillator 402 are easily lined up in the measurement after the control signal input with respect to the embodiment 1. As a result, it is possible to obtain a measurement result with a higher degree of accuracy.

Figure 5:
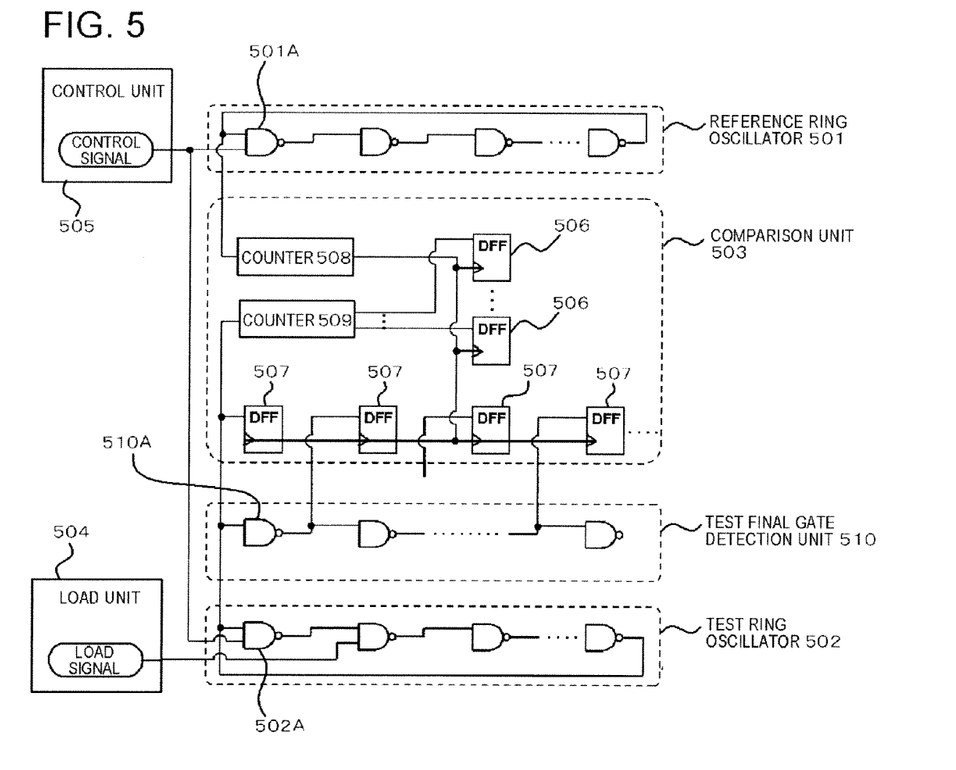
FIG. 5 is a block diagram illustrating a specific example of the configuration of the aging diagnostic device according to the embodiment 3.

Next, a specific example of an aging diagnostic device according to the embodiment will be described with reference to FIG. 5. FIG. 5 is based on the specific example of the embodiment 1 described with reference to FIG. 2, and is different therefrom in that the aging diagnostic device includes a test final gate detection unit 510. Hereinafter, the difference from the specific example of the embodiment 1 will be described. Meanwhile, the description with respect to the common point will not be repeated.

The test final gate detection unit 510 is configured to serially connect the logic gates having the same number and configuration as those of the test ring oscillator 502. A load unit 504 inputs the load signal to the test ring oscillator 502 and the test final gate detection unit 510 in the same conditions.

An output signal of an M-th logic gate of the test ring oscillator 502 is input to a flip-flop circuit 507, and is input to an initial logic gate 510A in the test final gate detection unit 510 in which a plurality of logic gate is connected in series. A plurality of flip-flop circuits 507 inputs each of the signals input to at least two of a plurality of logic gates constituting the test final gate detection unit 510, preferably, all the logic gate, and stores input values at that time.

The flow of the process based on this configuration example is realized according to the embodiment 1. Therefore, the detailed description herein will not be repeated.

In the configuration example, information acquired from the test ring oscillator 502 by the comparison unit 503 is the same as information acquired from a reference ring oscillator 501. Therefore, the drive loads of the reference ring oscillator 501 and the test ring oscillator 502 are easily lined up, and thus the measurement with a high degree of accuracy is realized.

Embodiment 4

An aging diagnostic device according to an embodiment 4 is based on the embodiments 2 and 3. Hereinafter, the difference between the embodiments 2 and 3 will be described. Meanwhile, the description with respect to the common point will not be repeated.

Figure 6:
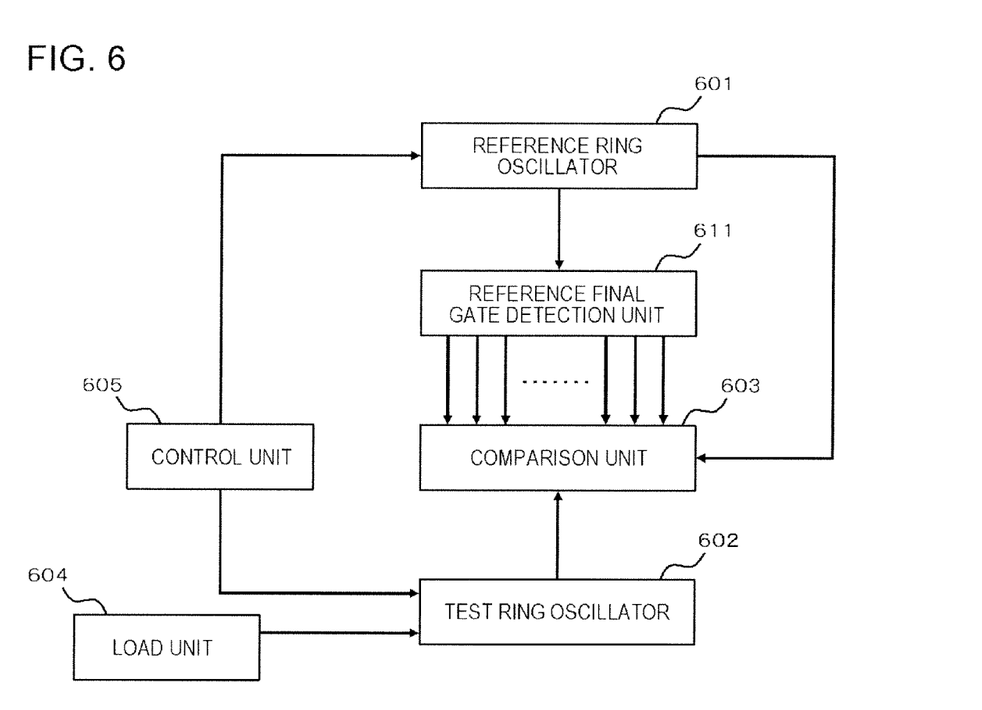
FIG. 6 is a block diagram illustrating a configuration of an aging diagnostic device according to an embodiment 4.

FIG. 6 is a block diagram illustrating a configuration of an aging diagnostic device according to the embodiment 4 of the invention. As shown in FIG. 6, the aging diagnostic device according to the embodiment includes a reference ring oscillator 601, a test ring oscillator 602, a comparison unit 603, a load unit 604, a control unit 605, and a reference final gate detection unit 611.

The aging diagnostic device according to the embodiment is different from the embodiment 2 in that the reference final gate detection unit 611 is included. In addition, the aging diagnostic device according to the embodiment is different from the embodiment 3 in that it includes the reference ring oscillator 601 as a first ring oscillator, and includes the test ring oscillator 602 as a second ring oscillator.

The reference final gate detection unit 611 can have the same configuration as that of the test final gate detection unit 410 (see FIG. 4) described in the embodiment 3. In addition, the relationship between the test final gate detection unit 410 and the comparison unit 403 and the relationship between the test final gate detection unit 410 and the test ring oscillator 402 can be realized by application thereof to the relationship between the reference final gate detection unit 611 and the comparison unit 603 and the relationship between the reference final gate detection unit 611 and the reference ring oscillator 601 which are shown in FIG. 6, respectively. Therefore, the detailed description herein will not be repeated.

With the configuration, an effect that the drive loads of the reference ring oscillator 601 and the test ring oscillator 602 are easily lined up is obtained with respect to the embodiment 2, and thus the measurement with a high degree of accuracy is realized.

Embodiment 5

Figure 7:
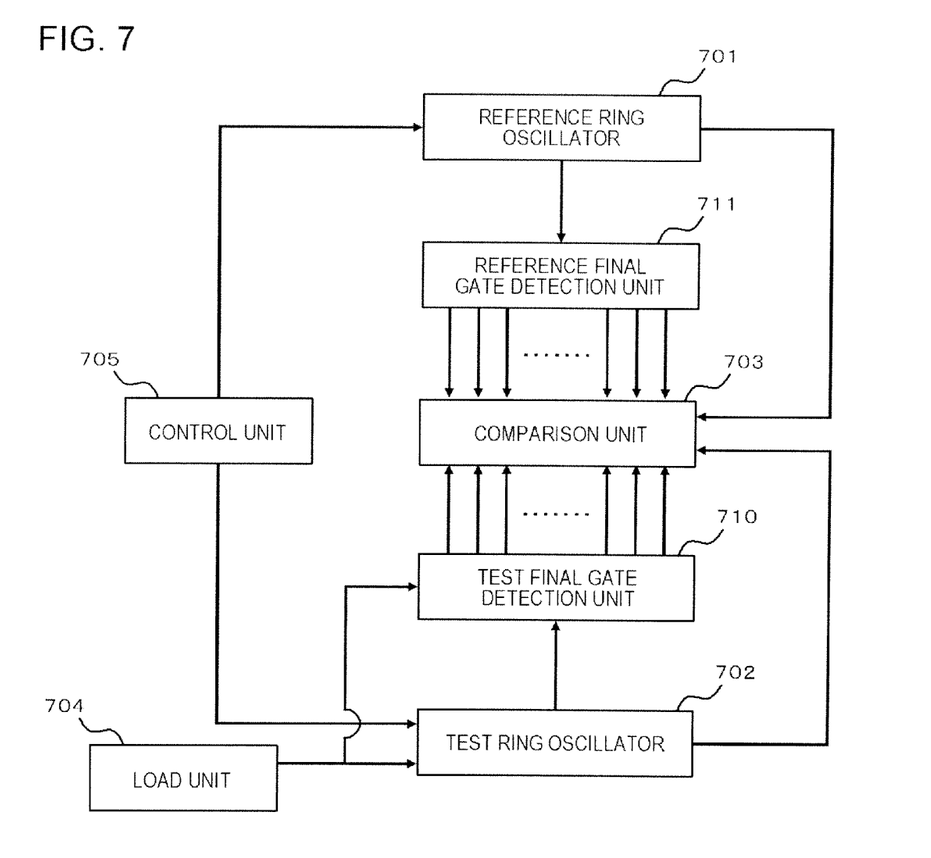
FIG. 7 is a block diagram illustrating a configuration of an aging diagnostic device according to an embodiment 5.

An aging diagnostic device according to an embodiment 5 is based on the embodiments 3 and 4. FIG. 7 is a block diagram illustrating a configuration of an aging diagnostic device according to the embodiment 5 of the invention. As shown in FIG. 7, the aging diagnostic device according to the embodiment includes a reference ring oscillator 701, a test ring oscillator 702, a comparison unit 703, a load unit 704, a control unit 705, a test final gate detection unit 710, and a reference final gate detection unit 711. That is, any of the configurations according to the embodiments 3 and 4 can be realized.

According to the aging diagnostic device of the embodiment, it is possible to realize an effect similar to the embodiments 3 and 4.

The application claims priority from Japanese Patent Application No. 2009-205774 filed on Sep. 7, 2009, the content of which is incorporated herein by reference in its entirety.

The invention claimed is:

1. An aging diagnostic device comprising:
a first ring oscillator that constitutes a ring oscillator using an odd-numbered plurality of logic gates constituted using a CMOS circuit;
a second ring oscillator that constitutes a ring oscillator using an odd-numbered plurality of logic gates having a same configuration as that of the logic gate;
a load unit that inputs a load signal to the first ring oscillator or the second ring oscillator;
a control unit that simultaneously inputs a control signal instructing a start of oscillation of the first ring oscillator and the second ring oscillator to the first ring oscillator and the second ring oscillator;
at least two first storage units that store signals output from at least two of the plurality of logic gates constituting the first ring oscillator at that time, respectively; and
a comparison unit that compares differences in the amount of movement of pulses within the first ring oscillator and the second ring oscillator, respectively, in the same time by using information stored in the first storage units.

2. The aging diagnostic device according to claim 1, wherein the second ring oscillator constitutes a ring oscillator using the logic gates having a same number as that of the first ring oscillators.

3. The aging diagnostic device according to claim 2, wherein when the logic gates of each of the first ring oscillator and the second ring oscillator to which the control signal is directly input from the control unit are set to first logic gates, and logic gates to which each output signal of N-th logic gates is input are set to (N+1)-th logic gates, the comparison unit includes a first counter that counts a pulse number of an output signal of an M-th logic gate of the first ring oscillator, a second counter that counts a pulse number of an output signal of an M-th logic gate of the second ring oscillator; and a second storage unit to which a count value of the first counter is input, and when the second counter counts a predetermined number which is previously set, using the count of the predetermined number as a trigger, the second counter outputs a signal for data storage to the first storage unit and the second storage unit.

4. The aging diagnostic device according to claim 3, wherein the comparison unit includes a plurality of first storage units that store signals output from all the logic gates constituting the first ring oscillator at that time, respectively.

5. An aging diagnostic method comprising:

inputting a load signal to a first ring oscillator that constitutes a ring oscillator using an odd-numbered plurality of logic gates constituted using a CMOS circuit or a second ring oscillator that constitutes a ring oscillator using an odd-numbered plurality of logic gates having a same configuration as that of the logic gate;

simultaneously inputting a control signal that instructs a start of oscillation of the first ring oscillator and the second ring oscillator to the first ring oscillator and the second ring oscillator;

storing, by at least two first storage units, signals output from at least two of the plurality of logic gates constituting the first ring oscillator at that time, respectively; and comparing differences in an amount of movement of pulses within the first ring oscillator and the second ring oscillator, respectively, in the same time by using information stored in the first storage units.

6. The aging diagnostic method according to claim 5, wherein the second ring oscillator constitutes a ring oscillator using the logic gates having a same number as that of the first ring oscillators.

7. The aging diagnostic method according to claim 6, wherein when the logic gates of each of the first ring oscillator and the second ring oscillator to which the control signal is directly input from the control unit are set to first logic gates, and logic gates to which each output signal of an N-th logic gates is input are set to (N+1)-th logic gates, in a case where a count value of a pulse number of an output signal of an M-th logic gate of the first ring oscillator becomes a predetermined number which is previously set, using the count of the predetermined number as a trigger, the comparing differences in the amount of movement of pulses includes detecting the amount of movement of pulses within the second ring oscillator by detecting a count value of a pulse number of an output signal of an M-th logic gate of the second ring oscillator and a value of an output signal of each of the plurality of logic gates constituting the second ring oscillator, using the count of the predetermined number as a trigger.

* * * * *